(12) United States Patent
Fang et al.

(10) Patent No.: US 8,362,511 B2
(45) Date of Patent: Jan. 29, 2013

(54) SEMICONDUCTOR LIGHT EMITTING STRUCTURE

(75) Inventors: Kuo-Lung Fang, Hsinchu County (TW); Chia-En Lee, Chiayi (TW); Chao-Chen Ye, Yunlin County (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/225,171

(22) Filed: Sep. 2, 2011

(65) Prior Publication Data
US 2012/0286307 A1 Nov. 15, 2012

(30) Foreign Application Priority Data

May 10, 2011 (TW) .................................. 100116407

(51) Int. Cl.
*H01L 29/18* (2006.01)
(52) U.S. Cl. ................ 257/98; 257/88; 257/99
(58) Field of Classification Search .................... 257/98, 257/99
See application file for complete search history.

(56) References Cited

U.S. PATENT DOCUMENTS

2009/0159908 A1 6/2009 David et al.

*Primary Examiner* — Steven Loke
*Assistant Examiner* — Kimberly M Thomas
(74) *Attorney, Agent, or Firm* — McClure, Qualey & Rodack, LLP

(57) ABSTRACT

A semiconductor light emitting structure including a substrate, a second type electrode layer, a reflecting layer, an insulating layer, a first type electrode layer, a first type semiconductor layer, an active layer and a second type semiconductor layer is provided. The second type electrode layer formed on the substrate has a current spreading grating formed by several conductive pillars and conductive walls, which are staggered and connected to each other. The reflecting layer and the insulating layer are formed on the second type electrode layer in sequence, and cover each conductive pillar and each conductive wall. The first type electrode layer, the first type semiconductor layer and the active layer are formed on the insulating layer in sequence. The second type semiconductor layer is formed on the active layer, and covers each conductive pillar and each conductive wall.

10 Claims, 6 Drawing Sheets

220g

220h

SEMICONDUCTOR LIGHT EMITTING STRUCTURE

This application claims the benefit of Taiwan application Serial No. 100116407, filed May 10, 2011, the subject matter of which is incorporated herein by reference.

BACKGROUND OF THE INVENTION

1. Field of the Invention

The invention relates in general to a semiconductor light emitting structure, and more particularly to a semiconductor light emitting structure with current spreading grating.

2. Description of the Related Art

The light-emitting diode (LED) emits the light mainly by way of converting electrical energy into optical energy. The LED is mainly formed by semiconductors, wherein the semiconductor including higher ratio of holes carrying positive charges is referred as a P type semiconductor, and the semiconductor including higher ratio of electrons carrying negative charges is referred as a N type semiconductor. The joint between the P type semiconductor and the N type semiconductor forms a PN joint. When a voltage is applied to the positive electrode and the negative electrode of an LED, the electrons and the holes are combined together and emitted in the form of a light.

Due to the advantages such as long lifespan, low temperature and high energy utilization rate, LED has been widely used in backlight modules, lamps, traffic lights, and vehicle brake light in recent years, and gradually replaces conventional light sources.

Additionally, the luminance of an LED has much to do with the density of the current applied thereto. In general, the larger the current density, the higher the luminance. Therefore, how to make the current density uniformly distributed so as to increase the quantum efficiency inside the LED has become an imminent task for the industries.

SUMMARY OF THE INVENTION

The invention is directed to a semiconductor light emitting structure, which increases electrode contact area through a current spreading grating for resolving the problems of current crowding and non-uniformed distribution of current density.

According to an aspect of the present invention, a semiconductor light emitting structure is provided. The semiconductor light emitting structure includes a substrate, a second type electrode layer, a reflecting layer, an insulating layer, a first type electrode layer, a first type semiconductor layer, an active layer, a second type semiconductor layer and a first contact pad. The substrate includes a luminous zone and a non-luminous zone. The second type electrode layer is formed on the substrate having a current spreading grating formed located within the luminous zone, wherein the current spreading grating is formed by several conductive pillars and conductive walls which are staggered and connected to each other. Each conductive pillar and each conductive wall respectively have a first top surface and a second top surface parallel to the substrate. The reflecting layer and the insulating layer are formed on the second type electrode layer in sequence, and cover each conductive pillar and each conductive wall, and each first top surface and each second top surface are exposed. The first type electrode layer, the first type semiconductor layer and the active layer are formed on the insulating layer located within the luminous zone in sequence. The second type semiconductor layer is formed on the active layer, and covers each conductive pillar and each conductive wall. The first contact pad is formed on the first type electrode layer located within the non-luminous zone of the substrate.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
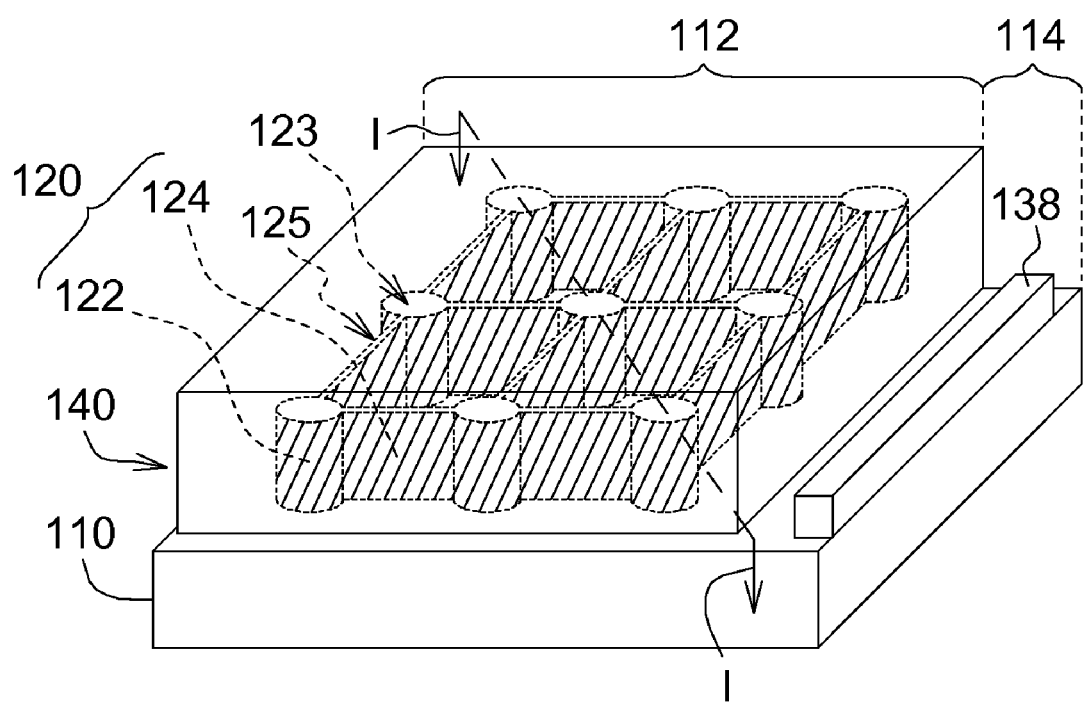
FIG. 1 shows a schematic view of a semiconductor light emitting structure according to an embodiment of the invention.

The semiconductor light emitting structure of the present embodiment increases electrode contact area through a current spreading grating which is a 3D structure formed by several conductive pillars and conductive walls, which are staggered and connected to each other. Referring to FIG. 1, a schematic view of a semiconductor light emitting structure according to an embodiment of the invention is shown. Each conductive pillar 122 and each conductive wall 124 respectively have a first top surface 123 and a second top surface 125 parallel to the substrate 110. The first top surface 123 of each conductive pillar 122 and the second top surface 125 of each conductive wall 124 are interconnected to form a grating pattern. In an embodiment, the current spreading grating 120 is formed by several polygonal basic structures whose shape includes triangle, square, rectangle, diamond, trapezoid or a combination thereof. The invention does not impose specific restriction with regard to the pattern of the grating. A number of embodiments are exemplified below for description purpose, not for limiting the scope of protection of the invention.

Figure 2:
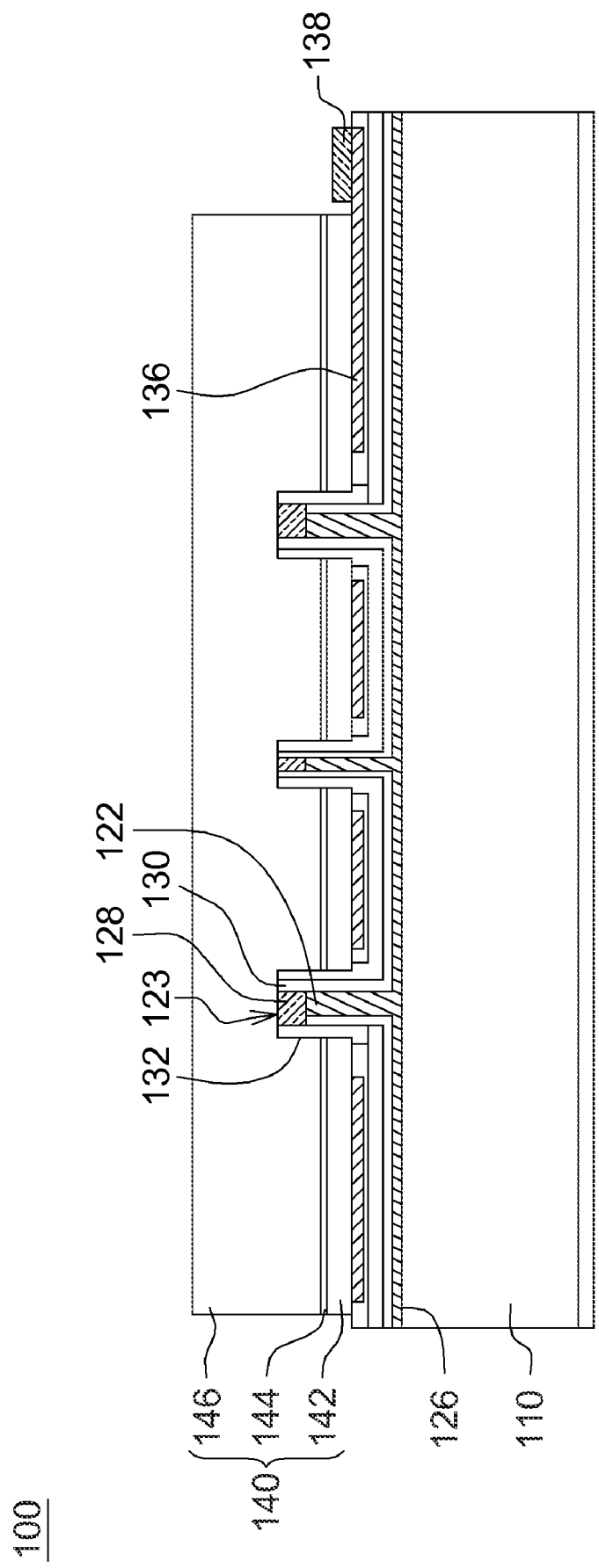
FIG. 2 shows according to a cross-sectional view of a semiconductor light emitting structure an embodiment of the invention.

Referring to FIGS. 1 and 2. FIG. 2 a cross-sectional view viewed along the I-I cross-sectional line of the semiconductor light emitting structure of FIG. 1. The semiconductor light emitting structure 100 includes a substrate 110, a second type electrode layer 126, a reflecting layer 130, an insulating layer 132, a first type electrode layer 136, a first type semiconductor layer 142, an active layer 144 and a second type semiconductor layer 146, which are arranged in a top-down sequence. The substrate 110 includes a luminous zone 112 and a non-luminous zone 114. The second type electrode layer 126 is formed on the substrate 110 and has a current spreading grating 120 located within the luminous zone 112, wherein the current spreading grating 120 is formed by several conductive pillars 122 and several conductive walls 124, which are staggered and connected to each other. Each conductive pillar 122 and each conductive wall 124 respectively have a first top surface 123 and a second top surface 125 parallel to the substrate 110. In an embodiment, the conductive pillars 122 and the conductive walls 124 are uniformly distributed located within the luminous zone 112 for increasing electrode contact area, so that the current is uniformly distributed and the luminous efficiency of the LED 140 is increased accordingly.

In addition, the reflecting layer 130 and the insulating layer 132 are formed on the second type electrode layer 126 in sequence, and cover each conductive pillar 122 and each conductive wall 124, and each first top surface 123 and each second top surface 125 are exposed over the reflecting layer 130 and the insulating layer 132. The reflecting layer 130 can be formed by such as a low-resistance metal layer or a Bragg reflecting layer. Thus, the light generated by the active layer 144 is directly emitted outward and at the same time is reflected through the reflecting layer 130, hence increasing the luminous flux.

Besides, the first type electrode layer 136, the first type semiconductor layer 142 and the active layer 144 are formed on the insulating layer 132 located within the luminous zone 112 in sequence. The second type semiconductor layer 146 is formed on the active layer 144, and covers each conductive pillar 122 and each conductive wall 124. In an embodiment, the first type electrode layer 136 is a P type electrode, and the second type electrode layer 126 is an N type electrode. The first type semiconductor layer 142 is a P type semiconductor layer electrically conducted with the P type electrode. The second type semiconductor layer 146 is an N type semiconductor layer electrically conducted with the N type electrode through each conductive pillar 122 and each conductive wall 124, so that the electrons carrying negative charges can be uniformly diffused in the N type semiconductor layer and combined with the holes carrying positive charges from the P type semiconductor layer on the active layer 144 (the P-N joint). The electrons and the holes which are combined together are emitted in the form of light and used as a light source of the LED 140.

In an alternative embodiment, the first type electrode layer 136 is an N type electrode, the second type electrode layer 126 is a P type electrode. The first type semiconductor layer 142 is an N type semiconductor layer electrically conducted with the N type electrode. The second type semiconductor layer 146 is a P type semiconductor layer electrically conducted with the P type electrode through each conductive pillar 122 and each conductive wall 124, so that the holes carrying positive charges are uniformly diffused in the P type semiconductor layer and combined with the electrons carrying negative charges from the N type semiconductor layer on the active layer 144 (P-N joint). The electrons and the holes which are combined together are emitted in the form of light and used as a light source of the LED 140. Therefore, the present embodiment increases electrode contact area through the conductive pillars 122 and the conductive walls 124 which are uniformly distributed located within the luminous zone 112, so that the current is uniformly distributed and the luminous efficiency of the LED 140 is increased.

Referring to FIG. 2, the semiconductor light emitting structure further includes a first contact pad 138 formed on the first type electrode layer 136 within the non-luminous zone 114 of the substrate 110. Furthermore, a second contact pad 128 is formed on the first top surface 123 of each conductive pillar 122. The first type electrode layer 136 can be formed by an alloy, such as nickel-gold alloy or indium tin oxide, wherein the contact resistance between the selected alloy and the first type semiconductor layer 142 is low. In addition, the second contact pad 128 can be formed by an alloy such as nickel-gold alloy or indium tin oxide, wherein the contact resistance between the selected alloy and the second type semiconductor layer 146 is low. When the contact resistance is low, the current density is more uniform, and the forward voltage between the first type semiconductor layer 142 and the second type semiconductor layer 146 can be reduced for increasing the luminous efficiency of the active layer 144.

The substrate 110 can be a conductive substrate 110 or a heat-dissipating substrate 110 commonly realized by such as a silicon substrate 110 or a copper substrate 110 for supporting the LED 140 and quickly dissipating or transferring the heat generated by the LED 140 to the exterior to avoid the heat being gathered inside the LED 140. In the present embodiment, the heat generated by the LED 140 can be downwardly transferred to the substrate 110 through each conductive pillar 122 and each conductive wall 124 so that the heat-dissipating efficiency of the semiconductor light emitting structure 100 is further increased.

A number of current spreading gratings with different patterns are disclosed below for description purpose. The embodiments are not mutually independent, and various embodiments can be realized through the modification or combination of different embodiments. For example, in FIG. 3A, the current spreading grating 220a formed by several squared structures can be modified as being formed by several rectangular structures, diamond structures and/or trapezoidal structures.

Figure 3A:
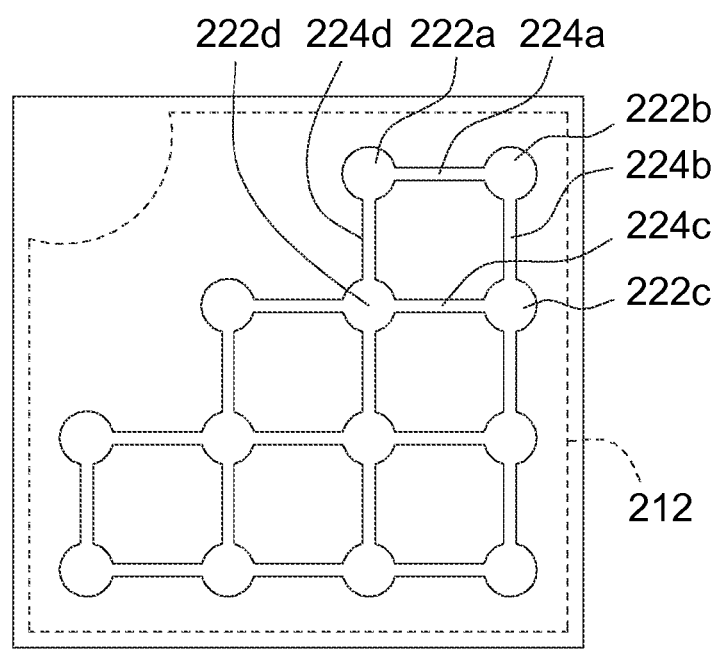
FIGS. 3A~3D respectively are schematic views of a current spreading grating of a semiconductor light emitting structure according to an embodiment of the invention.
Figure 3B:
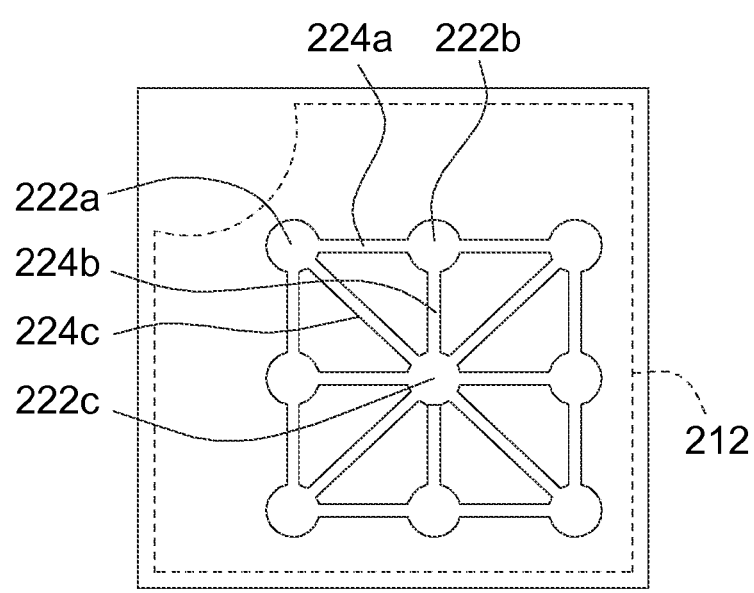
Figure 3C:
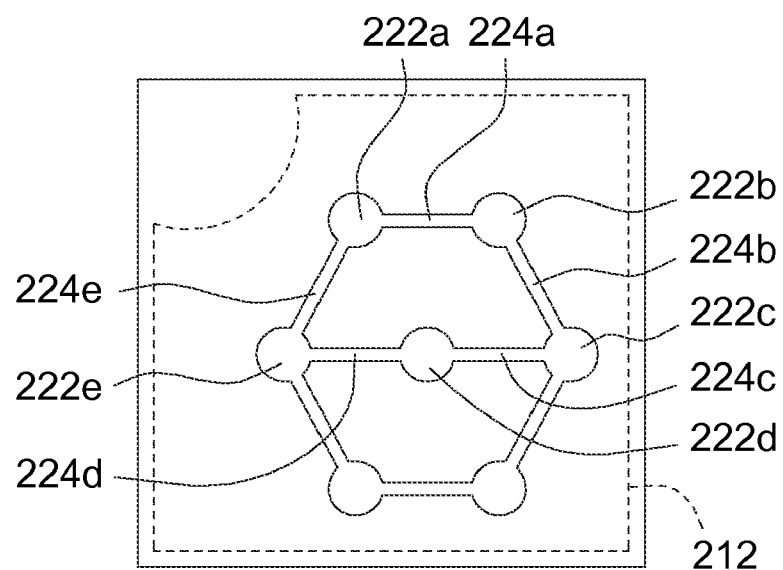
Figure 3D:
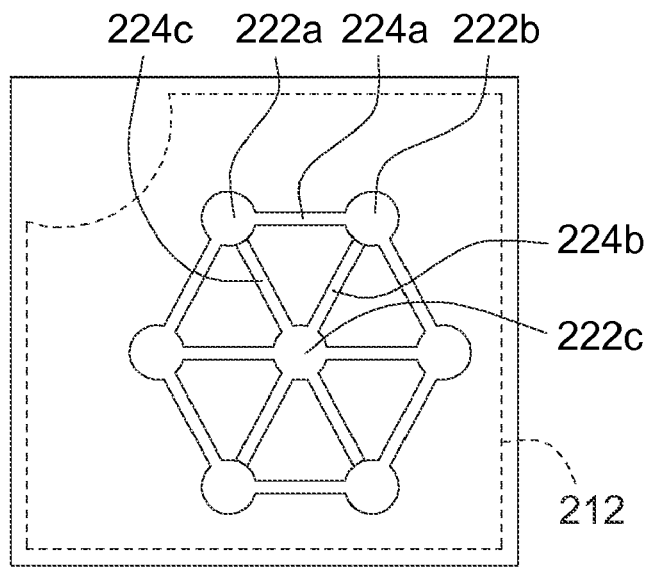

Referring to FIG. 3A~3D, schematic views of a current spreading grating of a semiconductor light emitting structure according to an embodiment of the invention are respectively shown. As indicated in FIG. 3A, the current spreading grating 220a located within the luminous zone 212 is formed by several squared structures, wherein each squared structure includes four conductive pillars 222a~222d and four conductive walls 224a~224d, which are staggered and connected to each other, to form a ladder-shape grating pattern. As indicated in FIG. 3B, the current spreading grating 220b located within the luminous zone 212 is formed by several orthogonal triangular structures, wherein each orthogonal triangular structure includes three conductive pillars 222a~222c and three conductive walls 224a~224d, which are staggered and connected to each other, to form a square grating pattern. As indicated in FIG. 3C, the current spreading grating 220c located within the luminous zone 212 is formed by several trapezoidal structures, wherein each trapezoidal structures include five conductive pillars 222a~222e and five conductive walls 224a~224e, which are staggered and connected to each other, to form a hexagonal grating pattern. As indicated in FIG. 3D, the current spreading grating 220d located within the luminous zone 212 is formed by several equilateral triangular structures, wherein each equilateral triangular structure includes three conductive pillars 222a~222c and three conductive walls 224a~224c, which are staggered and connected to each other, to form a hexagonal grating pattern. The above grating patterns are for exemplification purpose only, not for limiting the scope of protection of the invention.

Figure 4A:
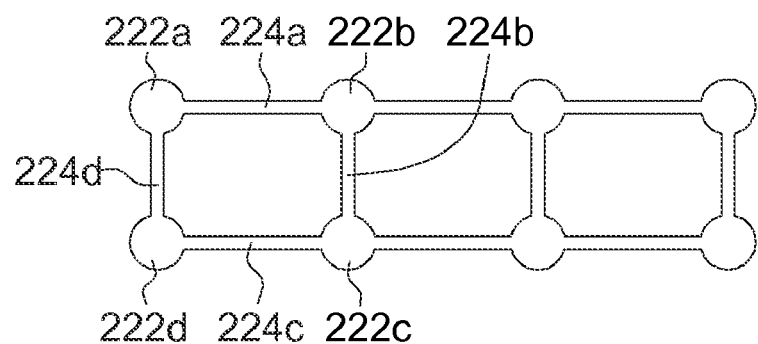
FIGS. 4A~4D respectively are schematic views of a current spreading grating of a semiconductor light emitting structure according to an embodiment of the invention.
Figure 4B:
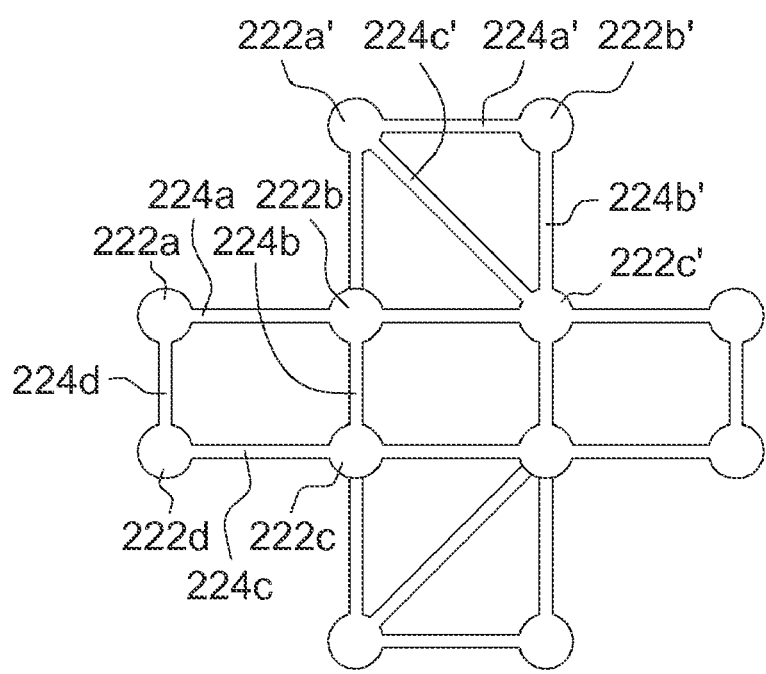
Figure 4C:
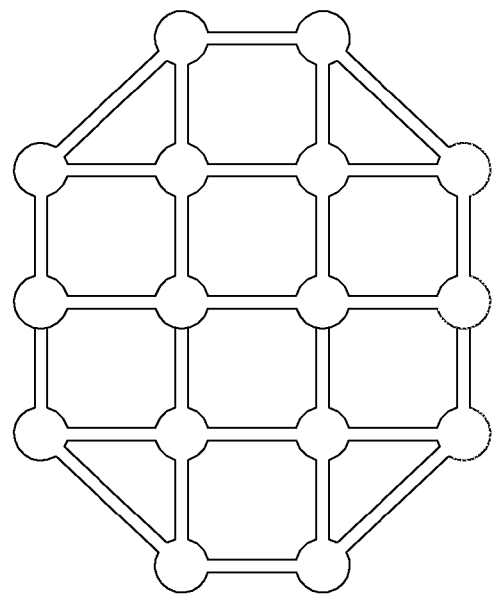
Figure 4D:
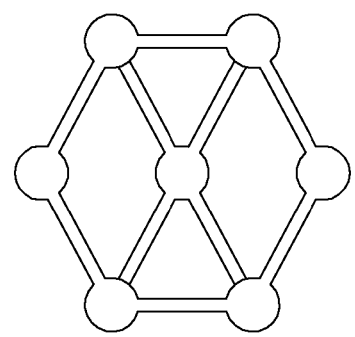

Referring to FIG. 4A~4D, schematic views of a current spreading grating of a semiconductor light emitting structure according to an embodiment of the invention are respectively shown. As indicated in FIG. 4A, the current spreading grating 220e is formed by several rectangular structures, wherein each rectangular structure includes four conductive pillars 222a~222d and four conductive walls 224a~224d, which are staggered and connected to each other, to form a strip-shaped grating pattern. As indicated in FIG. 4B, the current spreading grating 220f is formed by several rectangular structures and orthogonal triangular structures, wherein each rectangular structure includes four conductive pillars 222a~222d and four conductive walls 224a~224d, which are staggered and connected to each other, and each orthogonal triangular structure include three conductive pillars 222a'~222c' and three conductive walls 224a'~224c', which are staggered and connected to each other, to form a cross-shaped grating pattern. As indicated in FIG. 4C, the current spreading grating 220g is formed by several squared structures and orthogonal triangular structures, wherein each squared structure includes four conductive pillars and four conductive walls, which are staggered and connected to each other, and each orthogonal triangular structure includes three conductive pillars and three conductive walls, which are staggered and connected to each other, to form an octagonal grating pattern. As indicated in FIG. 4D, the current spreading grating 220h is formed by several equilateral triangular structures and diamond structures, wherein each equilateral triangular structure includes three conductive pillars and three conductive walls, which are staggered and connected to each other, and each diamond structure includes four conductive pillars and four conductive walls, which are staggered and connected to each other, to form a hexagonal grating pattern. The above grating patterns are for exemplification purpose only, not for limiting the scope of protection of the invention.

According to the semiconductor light emitting structure disclosed in the above embodiments of the invention, the electrode contact area is increased through the current spreading grating. The current spreading grating is a 3D structure formed by several conductive pillars and conductive walls which are staggered and connected to each other, so that the current will not be gathered on the conductive pillars. Instead, the current is diffused to the peripheral regions through the conductive walls surrounding the conductive pillars for resolving the problems of current crowding and non-uniform distribution of current density. Since the current is more uniformly distributed within the luminous zone, the quantum efficiency of the LED is improved and the luminance of the LED is increased accordingly.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor light emitting structure, comprising:
   a substrate having a luminous zone and a non-luminous zone;
   a second type electrode layer formed on the substrate, wherein a current spreading grating formed by a plurality of conductive pillars and a plurality of conductive walls, which are staggered and connected to each other, is formed within the luminous zone, and each conductive pillar and each conductive wall respectively have a first top surface and a second top surface parallel to the substrate;
   a reflecting layer and an insulating layer formed on the second type electrode layer in sequence, wherein the reflecting layer and the insulating layer cover the conductive pillars and the conductive walls, and the first and the second top surface are exposed;
   a first type electrode layer, a first type semiconductor layer, an active layer formed on the insulating layer located within the luminous zone in sequence;
   a second type semiconductor layer formed on the active layer, wherein the second type semiconductor layer covers the conductive pillars and the conductive walls; and
   a first contact pad formed on the first type electrode located within the non-luminous zone.

2. The semiconductor light emitting structure according to claim 1, wherein the first type is P type, and the second type is N type.

3. The semiconductor light emitting structure according to claim 1, wherein the first type is N type, and the second type is P type.

4. The semiconductor light emitting structure according to claim 1, wherein the reflecting layer is formed by a metal layer or a Bragg reflecting layer.

5. The semiconductor light emitting structure according to claim 2, wherein the reflecting layer is formed by a metal layer or a Bragg reflecting layer.

6. The semiconductor light emitting structure according to claim 3, wherein the reflecting layer is formed by a metal layer or a Bragg reflecting layer.

7. The semiconductor light emitting structure according to claim 1, wherein the current spreading grating comprises a polygonal basic structure formed by the conductive pillars and the conductive walls.

8. The semiconductor light emitting structure according to claim 7, wherein the polygonal basic structure comprises triangle, square, rectangle, diamond, trapezoid or a combination thereof.

9. The semiconductor light emitting structure according to claim 1, further comprising a second contact pad formed on the first top surface of each conductive pillar.

10. The semiconductor light emitting structure according to claim 1, wherein the substrate is a conductive substrate or a heat-dissipating substrate.

* * * * *